United States Patent [19]
Weidman

[11] Patent Number: 4,921,321
[45] Date of Patent: May 1, 1990

[54] SILICON NETWORK POLYMERS

[75] Inventor: Timothy W. Weidman, Summit, N.J.

[73] Assignee: American Telephone and Telegraph Company, New York, N.Y.

[21] Appl. No.: 343,966

[22] Filed: Apr. 27, 1989

[51] Int. Cl.$^5$ .............................................. G02B 6/10
[52] U.S. Cl. .............................. 350/96.12; 350/96.34; 528/33
[58] Field of Search .......................... 350/96.12, 96.34; 528/12, 42, 43, 33

[56] References Cited

PUBLICATIONS

West; "Journal of Organometallic Chemistry"; vol. 300, pp. 327–346; 1986.
Miller, R. D., *Materials for Microlithography: Radiation Sensitive Polymers*, American Chemical Society, Washington, D.C. 1984.
West R. and Indriksons, A., *Journal of the American Chemical Society*, 94, 6110 (1972).
Seyferth, D. and Yu, Y.-F., *Design of New Materials*, D. L. Cocke and A. Clearfield Eds., Plenum Publishing, 1986.
*Integrated Optical Circuits and Components*, Lynn Hutchinson, Ed. 1987, Marcel Dekker, Inc., New York.
Mucha, J. A. and Hess, D. W., *Introduction to Microlithography*, L. F. Thompson, Ed., American Chemical Society Symposium Series, No. 219, 1983.
Verbeek, B. H., et al., *Journal of Lightwave Technology*, 6, 1011 (1988).
Okomura, Y., et al., *Applied Optics*, 22, 3892, (1983).

*Primary Examiner*—William L. Sikes
*Assistant Examiner*—Robert E. Wise
*Attorney, Agent, or Firm*—Bruce S. Schneider

[57] ABSTRACT

A new class of silicon compounds having a high percentage of silicon atoms bonded to three other silicon atoms has been synthesized. These materials denominated polysilynes form smooth amorphous films which have quite useful properties. For example, photooxidation produces a refractive index change from 1.70 to 1.45. Similarly, photooxidation also produces a substantial change in solubility. Thus the materials are useful for the fabrication of optical and electronic devices.

11 Claims, 3 Drawing Sheets

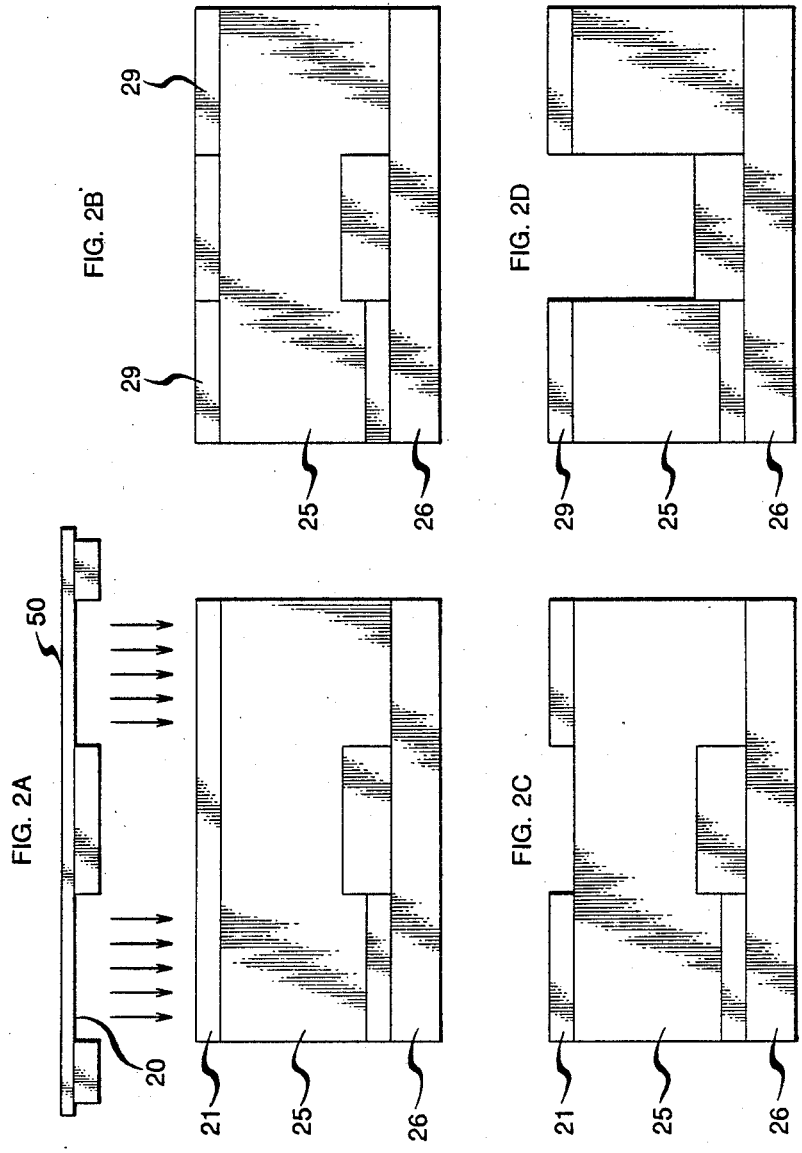

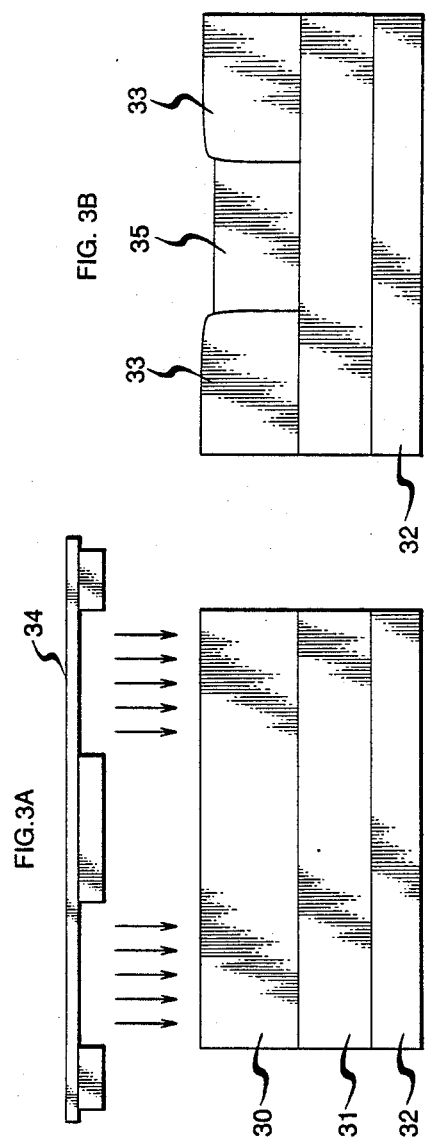

SILICON NETWORK POLYMERS

BACKGROUND OF THE INVENTION

1. Field of the Invention

This invention relates to devices employing silicon compounds and in particular to devices employing silicon compounds with Si—Si bonds.

2. Art Background

Silicon compounds are utilized for a variety of applications. Silicon dioxide is used as a common dielectric for a variety of devices including those having optical and/or electronic components. Other silicon compounds have also been suggested for use in the fabrication of such devices. In particular, polysilanes (linear polymers generically represented as $[R_1R_2Si]_n$ with each silicon atom bound to two other silicon atoms and to two organic substituents $R_1$ and $R_2$) have been synthesized. (See West in *Journal of Organometallic Chemistry*, 1986, page 300 to 327 and references cited therein.) These polymers, when irradiated with electromagnetic radiation, undergo degradation reactions to produce fragments that are significantly more soluble than the polymer. Thus, the materials have been suggested for use as positive photoresists in the fabrication of electronic devices. (See Miller, R. D. et al, *Materials for Microlithography: Radiation Sensitive Polymers*, American Chemical Society, Washington, D.C. 1984.) In such fabrication the resist is coated on the substrate, exposed to electromagnetic radiation in the desired pattern, and delineated with a solvent that removes selectively the irradiated portions.

A small number of polysilanes containing at least a few silicon atoms bound to three other silicon atoms have also been investigated. Materials in this class have been described West and Indrikson in *Journal of the American Chemical Society*, 94, 6110 (1972). A combination of methyltrichlorosilane and dimethyldichlorosilane is reduced using either sodium, potassium or mixtures of sodium and potassium in a tetrahydrofuran (THF) solvent. The resulting product includes bicyclic and tricyclic silicon ring compounds plus other poorly soluble, unidentified polymeric material, for which no application was suggested. Since the formation of articles such as optical or electronic devices relies on the deposition of the fabrication materials through processes such as solvation and spin coating, the insoluble materials of West and Indrikson are not of particular advantage.

Seyferth and Yu in *Design of New Materials*, D. L. Cocke and A. Clearfield Eds., Plenum Publishing, 1986, have reported related material approximately represented by $[MeH_xSi]_n$ in which x is about 0.40. Their synthesis involves a reduction with potassium in THF of methylhydrodichlorosilane. The resulting product is characterized by the presence of one methyl group, bound hydrogen, and silicon bonds where approximately 60% of the silicon atoms are bound to three other silicon atoms. The resulting materials, like those reported by West and Indrikson, were essentially insoluble and thus again are not particularly desirable for device fabrication.

Devices such as solar cells have been produced from materials typically referred to as amorphous silicon. these materials include a high percentage of hydrogen and generally have up to 35 percent of the siliconatoms bound to three other silicon atoms. Amorphous silicon has been used successfully as a semiconductor material in devices such as solar cells. However, the material is generally deposited from the gas phase, and is extremely insoluble. It also absorbs strongly across the visible spectrum, making it unsuitable for use in some applications, e.g. waveguide applications. Thus, although interest and investigation have been intense concerning devices formed with materials having Si—Si bonds, the materials used typically have limited application.

SUMMARY OF THE INVENTION

Materials denominated polysilynes have been produced by the reaction of an alkyl or aryl trichlorosilane with liquid NaK alloy emulsions generated in organic solvents by high intensity ultrasound. The resulting polymers (nominally described as $[SiR_x]_n$ with $0.7 \leq x \leq 1.3$) after purification have more than 70% of their silicon atoms bound to three other silicon atoms and with substantially the remainder of the bonds to organic moieties. Polysilynes soluble in conventional solvent such as non-polar organic solvents, e.g. toluene or decalin, are amenable to spin coating and have extremely desirable properties.

The irradiation of these materials with ultraviolet light in the presence of oxygen results in photooxidation. This photooxidation results in the formation of material with both greatly reduced solubility and lower refractive index relative to the unoxidized polysilyne. Thus, optical devices such as passive waveguides and electronic devices are fabricated through use of these materials.

BRIEF DESCRIPTION OF THE DRAWING

FIGS. 2 and 3 are illustrative of processes involved in the invention.

DETAILED DESCRIPTION

Figure 1:
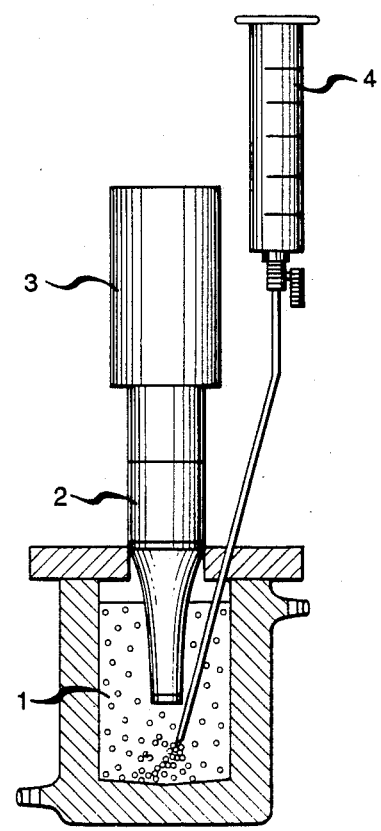
FIG. 1 is illustrative of an apparatus useful in fabricating materials involved in the invention.

The applicant's invention involves articles, such as devices containing optical and/or electronic elements, fabricated by the use of polysilynes. In the context of this invention polysilynes are polymeric, essentially amorphous materials having at least 70% of their silicon bound to an organic substituent and to three other silicon atoms. An advantageous method of producing such materials involves the reduction of alkyl or aryl trihalosilanes, e.g. trichlorosilanes (or a combination of such trihalosilanes). Reduction is preferably performed in an inert solvent with NaK alloy emulsion under conditions that make the reaction medium essentially homogeneous. Typically 2.7 to 3.3 equivalents of NaK are used for each equivalent of trihalosilane.

In one embodiment, homogeneity is provided by introducing a high intensity ultrasound wave into the reaction medium. Typically, ultrasound frequencies of approximately 20 KHz with powers in the range 200 to 400 W for reaction volumes in the range 100 mL to 1 liter are utilized. (Larger volumes require greater powers.) Generally, the power for a given reaction medium and volume is chosen to induce widespread cavitation that in turn produces shock waves which fracture and activate droplets of NaK. As a result, more complete reactivity with the alkylsilicon trihalide monomer is ensured. (Cavitation for the purposes of this invention is the formation and subsequent implosion of microscopic cavities under the influence of the acoustic field.) For reactive linear n-alkyl substituted trichorosilane monomers, the reaction is typically initiated in an inert alkane solvent such as pentane into which the more polar solvent THF is subsequently introduced to afford more complete reaction. For other alkyl substituted silanes and for aryl substituted silanes, solvents such as THF are advantageously employed from the onset. Generally, reaction times in the range 5 min to 20 min are sufficient to allow the essentially complete reaction of the NaK alloy. To effect even more complete reaction of all the halogen bound to silicon and to improve product stability, it is desirable after the reduction to react the product mixture with an alkylating agent such as an alkyl lithium or a Grignard reagent.

The alkyl or aryl substituent on the silane monomer also affects the properties of the product. For example, the size or steric bulk of the substituent (or mixture of substituents) present is correlated with the molecular weight of the polymer obtained (see Table 1). For silane reactants having n-alkyl substituents, the relative molecular weight of the resulting product typically ranges between 18,000 and 60,000 while more bulky substituents such as isopropyl, cyclohexyl or aryl substituents yield typical molecular weights in the range 1000 to 5000. (Molecular weights given are those measured by gel permeation chromatography. This form of chromatography is based on a comparison to polystyrene standards of known molecular weight but is sensitive to the shape of the molecule being measured. Thus, the values of molecular weight given for the polysilynes are possibly not absolute but provide a relative range and a point of comparison.)

The solubility and filtration properties are also influenced by the organic substituent. The most soluble of the polysilynes and those most amenable to filtration and optical quality film formation possess alkyl or substituted alkyl substituents bound to silicon atoms through a secondary carbon atom, i.e. carbon atoms bound in turn to two other carbon atoms. Polysilynes having increasing proportions of n-alkyl substituents directly bound to the silicon exhibit substantially reduced amenability to filtration.

The polymers, as obtained from the reaction process, generally contain significant amounts of impurities such as alkali metal halides and magnesium halides. These impurities are easily removed or substantially reduced by, for example, reprecipitation. In one embodiment reprecipitation is accomplished by dissolution of the crude polymer in a solvent such as tetrahydrofuran, filtration of the resulting mixture, e.g. through 0.45 $\mu$m Teflon ® membranes, followed by precipitation from a medium such as methanol.

The solubility attainable with polysilynes expedites device fabrication. In particular, it is possible to spin coat these materials to give thin layers on substrates such as a silicon substrate or a coated silicon substrate being processed into a device, e.g. an integrated circuit. Alternatively, it is also possible to coat substrates with a polysilyne region for processing into devices including passive thin film optical waveguides or interconnects. Generally, the surface of the substrate to be coated is covered with a filtered polysilyne solution and the substrate is spun. The greater the concentration and the slower the speed, the thicker the resulting layer. Typically concentrations in the range 5 to 40 wt % and speeds in the range 500 to 5000 rpm are employed to yield film thicknesses between 0.2 $\mu$m and 3.0 $\mu$m. For example 25 wt % solutions of polycyclohexylsilyne in toluene spun at 1000 rpm yield smooth transparent yellow films with thicknesses of approximately 1.2 $\mu$m.

Once the material is deposited, a variety of device fabrication steps are possible. For example, it is possible to photooxidize the material thus reducing its solubility, and lowering its refractive index. The exposure wavelength may be varied to effect the extent of photooxidation. Generally, the shorter the wavelength the greater the degree of oxidation that results. Controlling the degree of photooxidation controls the drop in refractive index between exposed and unexposed regions and/or adjusts the index of the waveguiding regions to a desired value, typically between 1.45 and 1.70. In this manner the refractive index of the polysilyne waveguide is controllable to match the index of, for example, a fiber or optical device or is controllable to produce other results.

Wavelengths typically useful for effecting polysilyne photooxidation cover the range between 220 nm and 450 nm with shorter wavelengths resulting in a higher degree of oxidation. The extent and rate of photooxidation at any particular wavelength also depends on such additional variables as ambient temperature, atmosphere (oxygen content), film thickness and substrate parameters. A control sample is employed to determine suitable parameters for a particular polysilyne formulation and a particular intended application.

A photooxidation gradient in the polysilyne film is created (or for most applications purposefully avoided) by controlling the total exposure dosage. For the purpose of fabricating waveguides or for applications involving the selective removal (for instance using a solvation process) of the unexposed area, it is desirable to select exposure dosages to allow photooxidation to proceed throughout the thickness of the film. An advantageous way to determine the appropriate exposure time is to apply the polysilane film of the desired thickness (typically between zero and three microns) to a fused silica wafer and to monitor the absorbance at the exposure wavelength. When the absorption of the film stabilizes (which for most purposes occurs as the absorption falls below 0.10 A.U. at the exposure wavelength) the film has reached a relatively uniform degree of oxidation characteristic of the exposure wavelength selected.

The exceptionally large drop in refractive index associated with polysilyne photooxidation makes possible their use in the high resolution photofabrication of optical waveguide structures. Passive waveguides are produced by, for example, exposing the polysilyne in all regions except those desired for guiding. In this manner, a higher refractive index region (the unexposed region) is surrounded by a lower refractive index region (the exposed region). For example, unoxidized poly(isopropylsilyne) has an initial refractive index of approximately 1.66 which, after photooxidation with 254 nm light, is reduced to a refractive index of 1.45. Polysilynes thus afford a single step, self-developing media for the fabrication of thin film optical waveguides. (Typical waveguiding structures are discussed in *Integrated Optical Circuits and Components*, Lynn Hutchinson, ed. 1987, Marcel Dekker, Inc., New York.) Exemplary techniques suitable for forming waveguides involve applying a polysilyne film, 30 in FIG. 3A typically ranging between 0.3 and 3.0 microns thick onto a suitable substrate or device structure, e.g. a substrate including layers 31 and 32, having a region, 31, of refractive index less than that of the polysilyne. The substrate or device is then exposed through a mask, 34, masking the polysilyne film in those areas, 35, intended to remain of higher index and exposing those regions, 33, to be of lower refractive index. Following this delineation sequence, it is often advantageous to perform a brief blanket exposure with short wavelength UV, (such as a single wavelength 254 nm or 248 nm source) to create a thin low index photooxidatively crosslinked surface layer over both the unexposed and the exposed areas. Alternatively, or in addition to such treatment, the film is exposed briefly to an oxygen plasma (i.e. using oxygen reactive ion etching conditions) to convert the surface of the film to $SiO_2$. Oxygen reactive ion etching is described by Mucha and Hess in *Introduction to Microlithography*, L. F. Thompson, Ed, American Chemical Society Symposium Series, No. 219, 1983. These expedients both decrease scattering losses and improve the mechanical integrity and stability for many applications.

Similarly, device patterns are produced by exposure through a mask with the desired pattern, with subsequent removal of the unexposed region utilizing either a solvent development or dry halogen ion etch process. The greater the extent of oxidization the less susceptible the material is to removal by reactive halogen ion etching. Thus, if after photooxidative patterning the material is subjected to a halogen plasma such as a chlorine plasma, the unoxidized (unexposed) material will be removed substantially faster than the exposed material. Alternatively, development is accomplished by subjecting the selectively photooxidized (patterned) material to a non-polar organic solvent, e.g. pentane, so that the unoxidized material is selectively dissolved and rinsed away with the solvent. The greater the degree of oxidization, the greater the selectivity of the development process. It is generally advisable to provide sufficient exposing energy so that oxidation has been induced throughout the thickness of the polysilyne material. With insufficient exposure, a bilayer with more highly oxidized material on the surface is formed resulting in undercutting and liftoff of the entire film during the development procedure. For example, the use of polycyclohexylsilyne exposed with a 310 nm exposure apparatus, yields resolution after development of better than 0.50 $\mu$m. Development by a wet chemical solvent process typically requires less than one minute while halogen plasma development generally requires between 1 and 30 minutes for layer thicknesses in the range 0.25 to 2.0 $\mu$m. Because both polysilynes and oxidized polysilynes possess exceptionally high percent compositions of silicon, under reactive oxygen ion etching conditions, they exhibit etch resistant properties closely approaching those of $SiO_2$ layers. This property makes possible uses such as application in multilevel pattern transfer processing using oxygen reactive ion etching. In an exemplary process, a thin layer of polysilyne (typically 0.1–0.5 microns), 21 in FIG. 2, is applied over an organic or other easily etched material covering a substrate including regions 25 and 26 being processed into a device. It is possible, for example, to employ the organic layer as a planarizing or dielectric region. This organic layer is generally between 0.5 and 10 microns thick. The polysilyne layer is then patterned by exposure of region 29 through a mask 50 using, for example, conventional photolithographic techniques employing such expedients as a contact print mask or projection printing apparatus, generally operating between 220 and 350 nm in air or an atmosphere enriched in oxygen. Development, such as by one of the methods previously described, leaves behind the photooxidized polysilyne as illustrated at 2C. Subjecting the device to oxygen reactive ion etching then removes the exposed organic layer yielding the structure shown at 2D.

The following examples are illustrative of conditions suitable for practicing the invention.

EXAMPLE 1

Exemplary Synthesis Procedure: Polyisopropylsilyne

Inside an inert atmosphere glovebox, NaK alloy (9.00 g, 290 meq) in 200 mL of THF was ultrasonically irradiated at full power using a 375 W 20 KHz ultrasonic converter 3 and titanium immersion horn 2 tapering to ½ inch diameter. To the NaK/THF alloy emulsion, 1, isopropyltrichlorosilane (17.8 g, 100 mmol) in 20 mL of pentane was added dropwise from a syringe, 4 over ten minutes with continuous sonication. Sonication was continued for five minutes after the addition was complete, after which the solution was transferred to a 500 mL Erlenmeyer flask and titrated with a 2.0M solution of isopropylmagnesium chloride in ethyl ether (approximately 5 mL required) until an aliquot (hydrolyzed outside the glovebox 0.5 mL solution plus 1.0 mL of water) showed a neutral pH. The resulting mixture was removed from the drybox and 200 mL of water was added under a stream of inert gas. After five minutes of vigorous stirring the mixture was allowed to separate. The organic phase was filtered and poured into approximately 400 mL of methanol. The resulting yellow precipitate was collected by filtration, washed with more methanol, dried, redissolved in THF, and reprecipitated by pouring it into about 400 mL of ethanol. The solid was separated by filtration, washed with more ethanol, and dried providing 1.75 g (25% yield) of purified poly(isopropylsilyne) as a fine yellow powder. The same procedure using cyclohexyltrichlorosilane rather than isopropyl trichlorosilane was employed for the synthesis of poly(cyclohexylsilyne) in 46% yield.

EXAMPLE 2

Exemplary Polymer Synthesis: Poly(n-hexylsilyne)

In an inert atmosphere glovebox, NaK alloy (8.86 g, 285 meq) was added dropwise directly beneath the tip of the activated sonication horn 2 immersed in a solution, 1, of n—$C_6H_{13}SiCl_3$ (21.96 g, 100 mmol) in 200 mL of pentane. After the addition was complete, ultrasonic irradiation was continued until the reaction mixture was thick and viscous (approximately five minutes). THF (200 mL) was then added and ultrasonic irradiation was continued for an additional five minutes. The reaction mixture was then stirred while a 1.20M solution of n-hexylmagnesium bromide in ethyl ether was added until a hydrolyzed aliquot of the solution tested at neutral pH (requiring approximately 12 mL). After stirring for an additional 30 minutes the resulting mixture was removed from the drybox and carefully poured into 200 mL of water under a stream of inert gas. The resulting yellow precipitate was quickly removed from the aqueous phase, redissolved in THF, and precipitated sequentially from water, methanol, and ethanol to give 3.7 g (33%) of poly(n-hexylsilyne) as a yellow hexane-soluble powder.

Waveguide Fabrication Procedures

EXAMPLE 3

A 25 wt % solution in toluene of the poly(isopropylsilyne) (synthesized as described in Example 1) was prepared and filtered through a 0.45 micron Teflon® membrane directly onto the surface of a four inch silicon wafer on which a 5.0 μm thick silicon oxide layer had been grown by high pressure thermal oxidation. The wafer was spun at 100 rpm for 60 seconds, to give a film 1.10 microns thick with an average refractive index (measured elipsometrically at 632 nm) of 1.655. The same solution was spin coated under identical conditions onto a 2.0"×1/16" fused silica wafer.

Exposures were performed using an Optical Associates Inc. apparatus containing a Xe-Hg lamp and a 300 nm cutoff filter, providing a peak output at about 310 nm of 7.5 mW/cm². The film on the fused quartz was used to determine the exposure time necessary to effect the bleaching of the absorption at 310 nm below 0.10 A.U., which in this case required 20 minutes. The polysilyne film on the SiO₂ coated silicon wafer was exposed through a quartz mask having a series of chromium lines to produce the sample patterned with 2.0, 5.0, and 10.0 micron wide waveguides. The refractive index of an exposed portion of the film after irradiation through a transparent area on the mask was determined by elipsometry to be 1.526. Exposure through the same mask to 254 nm light from low pressure Hg lamps resulted in a drop in refractive index to 1.45 (as also determined by ellipsometry).

The sample was cleaved to give a 5.0×5.0 cm square portion with straight edges to allow direct coupling to a single mode fiber. (The wafer before coating was prescored on the backside through half its thickness to facilitate this cleaving.) A near IR loss spectrum was recorded by the methods described by Verbeek et al. in *Journal of Lightwave Technology,* 6, 1011 (1988). The results indicated losses below 1 dB/cm between 1.25 and 1.4 microns, nd losses up to 10 dB/cm between 1.10 and 1.25 microns and between 1.45 and 1.60 microns.

EXAMPLE 4

A 12.5 wt. % solution of polycyclohexylsilyne (synthesis described in Example 1) was coated onto a silicon wafer coated with 2 μm of high molecular weight polymethyl methacrylate by spinning at 1000 rpm for 30 seconds, providing a film of thickness 0.58 microns. After film application, the presawed sample was cleaved, rinsed with deionized water, and blown dry. Ultraviolet exposure using the Optical Associates Inc. apparatus described in Example 3 at 310 nm was performed for 10 minutes (resulting in a total dose of 4500 mJ/cm) after which time a 30 second (400 mJ/cm²) flood exposure (without the mask) was done with an excimer laser source operating at 248 nm. Subsequently, this sample was subjected to a 30 mTorr oxygen plasma in a standard parallel plate reactive ion etch reactor operating at 90 W (13.6 MHz) for 5 minutes, producing a tough, thin amorphous silicon dioxide overlayer.

The loss characteristics of the 2.0 micron wide waveguides were evaluated at the two test wavelengths 632 and 810 nm. Losses were measured by a video scan technique described in Y. Okomura et al., *Applied Optics,* 22, 3892 (1983). Data was collected by a computer and loss numbers were extracted from a linear fit of the scattered power along the waveguide. With both 810 nm light of random polarization, and for the 632 nm line of a He/Ne laser source the loss was determined to be below 1.0 dB/cm for each waveguide studied.

TABLE I

| Polymer | $M_w$ | $M_n$ | Polydispersity $M_w/M_n$ |
|---|---|---|---|
| Polyisopropylsilyne 1 | 1,200 | 760 | 1.58 |
| Polyisopropylsilyne 1 sample 2 | 1,330 | 960 | 1.39 |
| Polyisopropylsilyne 1 sample 3 | 1,400 | 930 | 1.51 |
| Average | 1,310 | 880 | 1.49 |
| Polycyclohexylsilyne 2 | 1,600 | 1,120 | 1.44 |
| Polycyclohexylsilyne 2 sample 2 | 1,550 | 1,190 | 1.30 |
| Polycyclohexylsilyne 2 sample 3 | 1,630 | 1,240 | 1.31 |
| Average | 1,590 | 1,180 | 1.35 |
| Polyphenysilyne 3 | 2,600 | 1,200 | 2.17 |
| Polyphenysilyne 3 sample 2 | 2,300 | 1,600 | 1.44 |
| Polyphenysilyne 3 sample 3 | 3,430 | 1,640 | 2.08 |
| Average | 2,780 | 1,480 | 1.90 |
| Poly(n-hexyl)silyne | 45,100 | 13,400 | 3.36 |
| Poly(n-butyl)silyne | 21,300 | 9,480 | 2.25 |
| Poly(i-butyl)silyne | 3,860 | 1,920 | 2.01 |
| Poly(t-butyl)silyne | 350 | 300 | 1.17 |

I claim:

1. A process for producing a device comprising the steps of forming a region of polysilyne and oxidizing at least a portion of said region.

2. The process of claim 1 wherein said device comprises an optical device including a waveguide region.

3. The process of claim 2 wherein said polysilyne includes secondary alkyl substituents.

4. The process of claim 3 wherein said region is formed by spin coating.

5. The process of claim 1 wherein said region is formed by spin coating.

6. The process of claim 1 wherein said device comprises an electronic device.

7. The process of claim 1 including the step of subjecting said polysilyne to an oxygen plasma.

8. The process of claim 1 wherein said oxidation is induced by radiant energy.

9. An optical device comprising a region of silicon-containing material formed by the oxidation of a polysilyne wherein said silicon-containing region has a refractive index that differs from adjacent regions of said device such that a waveguide for electromagnetic radiation is present.

10. The device of claim 9 wherein said polysilyne includes secondary alkyl substituents.

11. The device of claim 9 wherein said radiation comprises coherent radiation.

* * * * *